(12) United States Patent
Joshkin et al.

(10) Patent No.: US 8,772,980 B2
(45) Date of Patent: Jul. 8, 2014

(54) BLUMLEIN ASSEMBLY WITH SOLID STATE SWITCH

(75) Inventors: Vladimir Andreevich Joshkin, Dublin, CA (US); Antonios Zografos, Oakland, CA (US); Dave Pearson, Livermore, CA (US)

(73) Assignee: Compact Particle Acceleration Corporation, Livermore, CA (US)

( * ) Notice: Subject to any disclaimer, the term of this patent is extended or adjusted under 35 U.S.C. 154(b) by 801 days.

(21) Appl. No.: 12/963,456

(22) Filed: Dec. 8, 2010

(65) Prior Publication Data

US 2012/0146553 A1   Jun. 14, 2012

(51) Int. Cl.
    *H03K 3/64*   (2006.01)
(52) U.S. Cl.
    USPC .......................................................... 307/106
(58) Field of Classification Search
    USPC .......................................................... 307/106
    See application file for complete search history.

(56) References Cited

U.S. PATENT DOCUMENTS

| | | |
|---|---|---|
| 2,465,840 A | 8/1944 | Blumlein |
| 2,825,760 A | 3/1958 | Clogston |
| 4,441,091 A | 4/1984 | Nishida et al. |
| 5,497,050 A | 3/1996 | Cheo |
| 5,511,944 A | 4/1996 | Ide et al. |
| 5,757,146 A | 5/1998 | Carder |
| 5,821,705 A | 10/1998 | Caporaso et al. |
| 6,239,671 B1 | 5/2001 | Smith |
| 6,320,334 B1 | 11/2001 | Roberge et al. |
| 6,573,813 B1 | 6/2003 | Joannopoulos et al. |
| 7,173,385 B2 | 2/2007 | Caporaso et al. |
| 7,174,485 B2 | 2/2007 | Silvus |

(Continued)

FOREIGN PATENT DOCUMENTS

WO   WO 2010/129804   11/2010

OTHER PUBLICATIONS

Rukin et al., Ultra-High-Power Repetitive Solid State DBD-Based Switching, *Pulsed Power Plasma Science*, 2001, vol. 1, pp. 329-332.

(Continued)

*Primary Examiner* — Hal Kaplan
(74) *Attorney, Agent, or Firm* — Davis Wright Tremaine LLP

(57) ABSTRACT

A blumlein assembly incorporating a solid-state switch is presented. In the exemplary embodiment, a semiconductor switch is placed between first and second conducting strips, with dielectric material filling in the space between the strips on either side of the switch. A third conductive strip, parallel to the other two strips, is separated from the middle one of the strips by another dielectric layer. Rather than having the switch attach directly to the dielectric material on either side, a holder or carrier structure is used, which may be formed of several pieces or of a monolithic structure. The holder is formed of a material whose dielectric constant is closer to that of the switch than the dielectric material on either side, but whose boundary with the dielectric on either side has at least a portion that extends in a non-orthogonal direction with respect to the conducting strips. The arrangement allows the structure to withstand higher electric field levels without breakdown. The exemplary switch is light activated and the holder structure also includes ferrules on either side of the holder, by which optic fibers can be optically coupled with the switch. The switch extends to either side beyond the conductive strips, so that the ferrules are not placed between these strips to again allow for the use of higher field values.

45 Claims, 6 Drawing Sheets

(56) References Cited

U.S. PATENT DOCUMENTS

| | | | |
|---|---|---|---|
| 7,615,942 B2* | 11/2009 | Sanders et al. | 315/505 |
| 7,649,328 B2 | 1/2010 | Smirnov et al. | |
| 7,679,297 B1 | 3/2010 | Stygar et al. | |
| 7,718,977 B2 | 5/2010 | Gorrell et al. | |
| 7,915,763 B1 | 3/2011 | Cargol | |
| 7,924,121 B2 | 4/2011 | Caporaso et al. | |
| 8,299,861 B2 | 10/2012 | Tatoian et al. | |
| 2008/0128641 A1 | 6/2008 | Henley et al. | |
| 2009/0224700 A1* | 9/2009 | Chen et al. | 315/505 |
| 2009/0261258 A1 | 10/2009 | Harris et al. | |
| 2010/0032580 A1 | 2/2010 | Caporaso et al. | |
| 2012/0126727 A1 | 5/2012 | Hamm | |

OTHER PUBLICATIONS

Caporaso et al., "High Gradient Induction Accelerator," *PAC '07*, Jun. 2007, Albuquerque, New Mexico, pp. 857-861.

Caporaso et al., "Status of the Dielectric Wall Accelerator," *PAC '09*, Vancouver, Canada, May 2009, pp. 3085-3089.

Sullivan et al., "6H-SiC Photoconductive Switches Triggered Below Bandgap Wavelengths," *Power Modulator Symposium and 2006 High Voltage Workshop*, Washington, D.C. 2006, 6 pages.

Sullivan et al., "Wide Bandgap Extrinsic Photoconductive Switches," *IEEE Transactions on Plasma Science*, vol. 36, No. 5, Oct. 2008, pp. 1-5.

Kelkar, "Silicon Carbide as a Photo Conductive Switch Material for High Power Applications," A Dissertation presented to University of Missouri-Columbia, Dec. 2006, pp. 1-126.

Caporaso, "New Trends in Induction Accelerator Technology," *Proceeding of the International Workshop on Recent Progress in Induction Linacs*, Tsukuba, Japan, Dec. 2002, 13 pages.

Caporaso et al., Compact Accelerator Concept for Proton Therapy: *Nuclear Instruments and Methods in Physics Research*, B 261, 2007, pp. 777-781.

Gyawali et al., "Comparative Study of Compensated Wide Band Gap Photo Conductive Switch Material for Extrinsic Mode Operations," *Proceedings of the 2008 IEEE International Power Modulators and High Voltage Conference*, May 27-31, 2008, pp. 5-8.

Partial International Search Report for International Application No. PCT/US2011/061631 mailed May 30, 2012, 2 pages.

Trask, "A Tutorial on Transmission Line Transformers," Sonoran Radio Research, Aug. 14, 2005, 7 pages.

"Transmission Line Transformers," www.bytemark.com/products/tlttheory.htm, Aug. 15, 2011, 3 pages.

U.S. Appl. No. 13/352,187 entitled High Voltage RF Opto-Electric Multiplier for Charged Particle Accelerators, filed Jan. 17, 2012, 23 pages.

U.S. Appl. No. 13/299,174 entitled "Sub-Nanosecond Beam Pulse Radio Frequency Quadrupole (RFQ) Linear Accelerator System," filed Nov. 17, 2011, 49 pages.

Notification of Transmittal of the International Search Report and the Written Opinion of the International Searching Authority, or the Declaration for International Application No. PCT/US2011/061631 mailed Sep. 6, 2012, 17 pages.

U.S. Appl. No. 61/680,782 entitled Improvements for High Voltage Opto-Electric Switch filed Aug. 8, 2012, 13 pages.

U.S. Appl. No. 13/610,051 entitled "Geometries for Placement of Solid State Switch in a Blumlein Assembly," filed Sep. 11, 2012, 34 pages.

U.S. Appl. No. 13/610,069 entitled "Illumination Techniques for Optically Activated Solid State Switch," filed, Sep. 11, 2012, 38 pages.

* cited by examiner

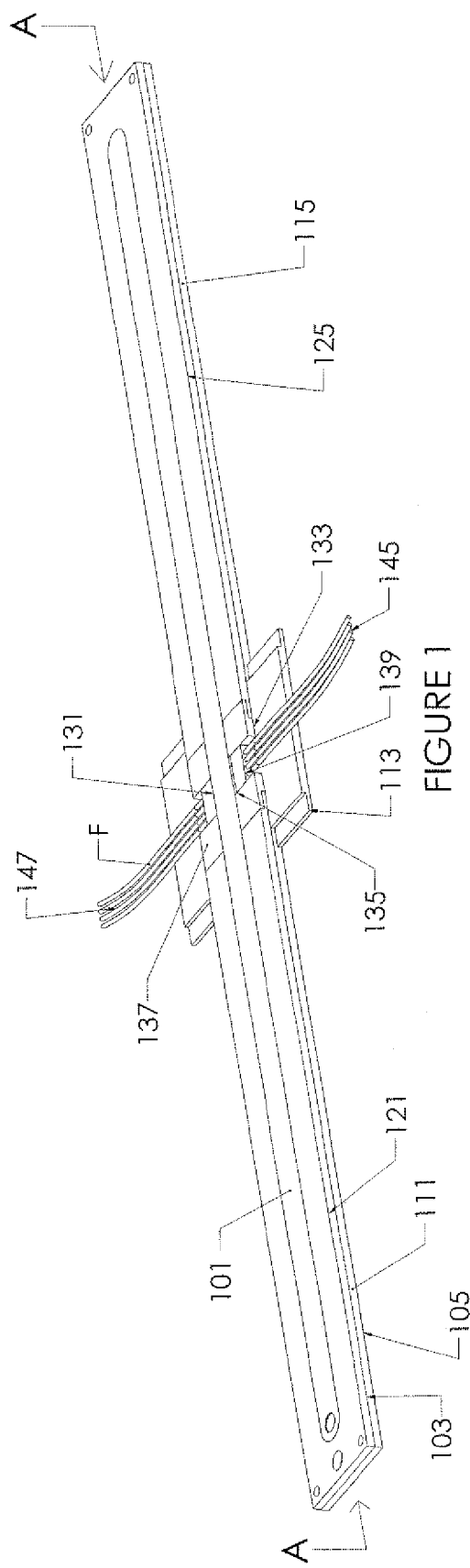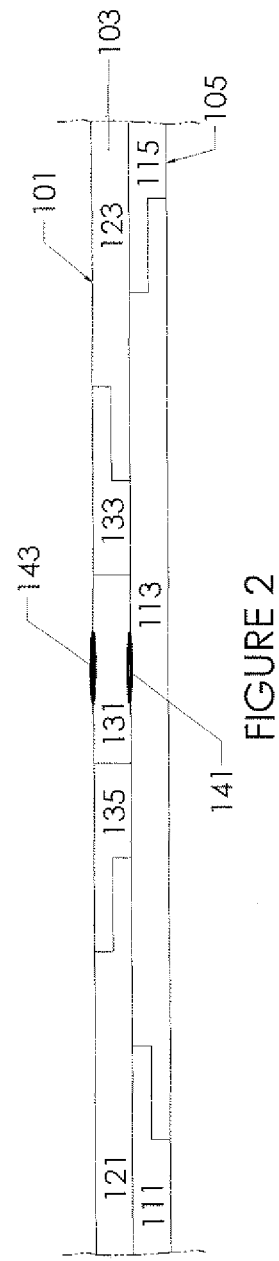

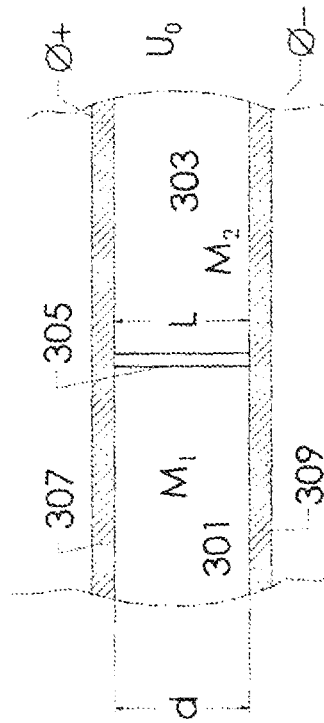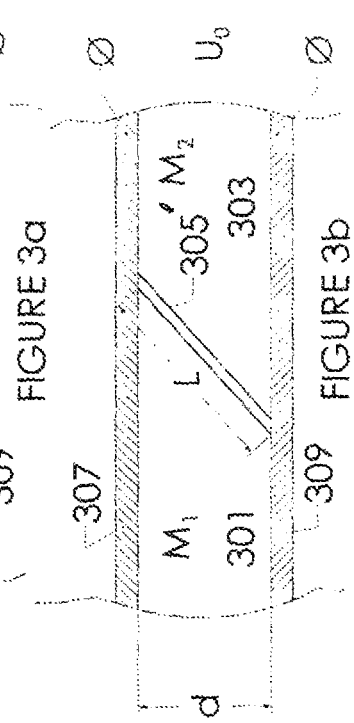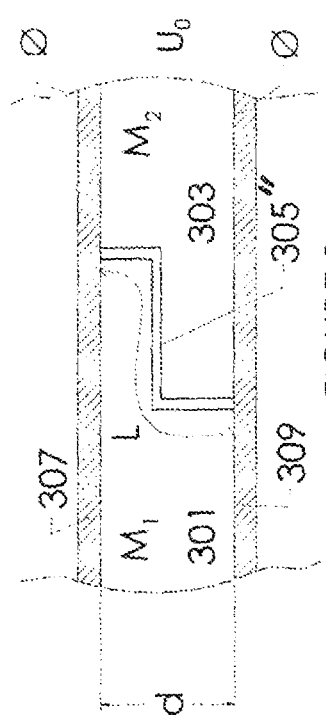

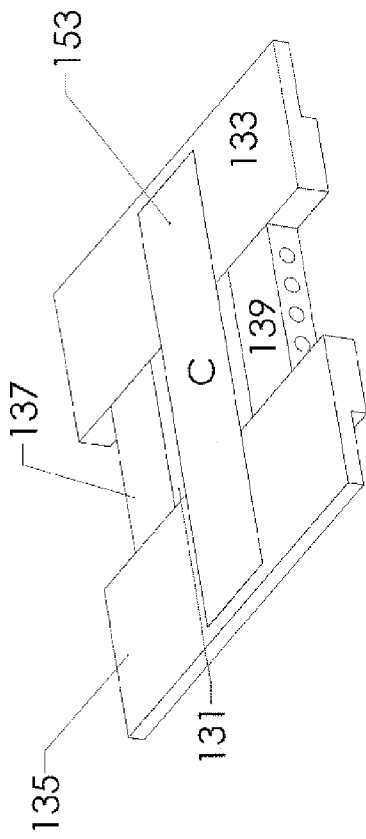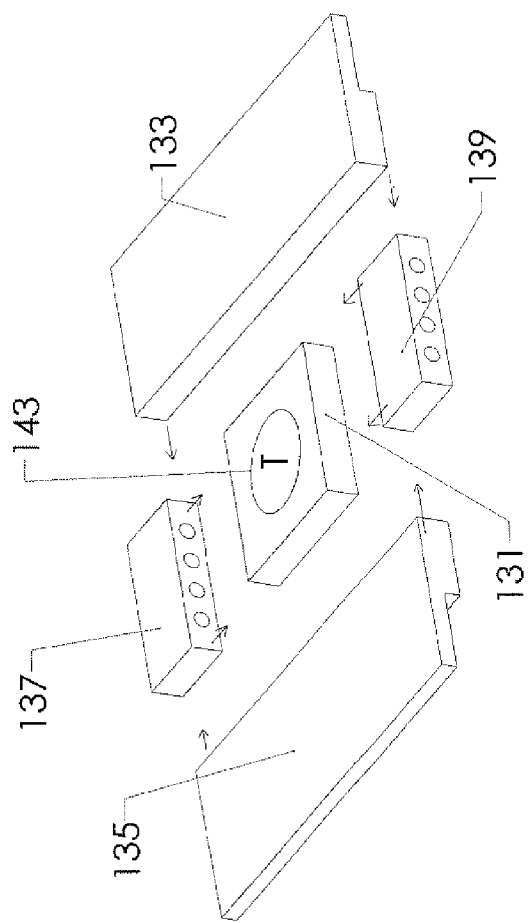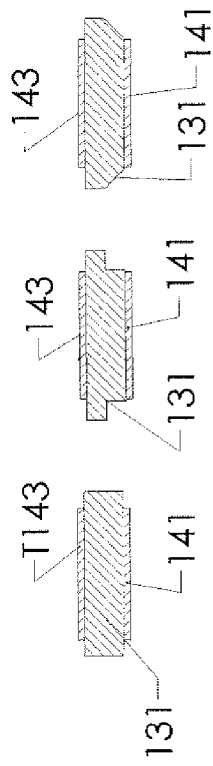
FIGURE 4a
FIGURE 4b
FIGURE 4c

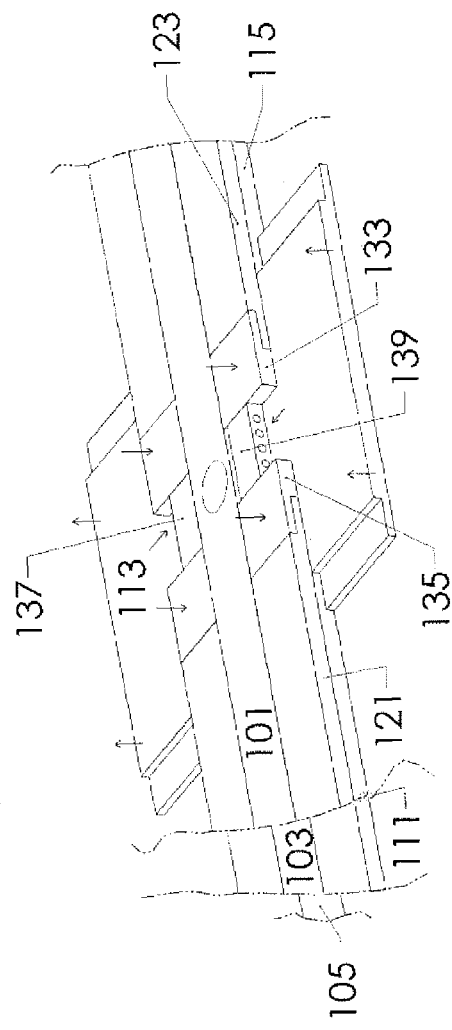
FIGURE 5c
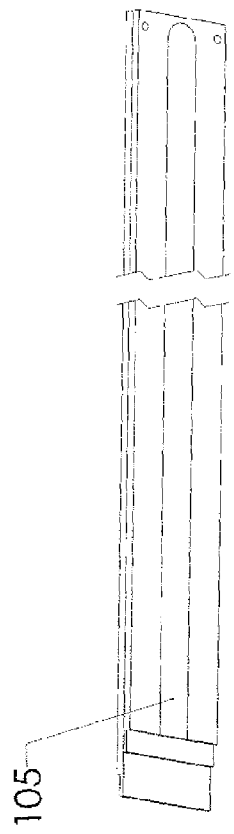
FIGURE 5d
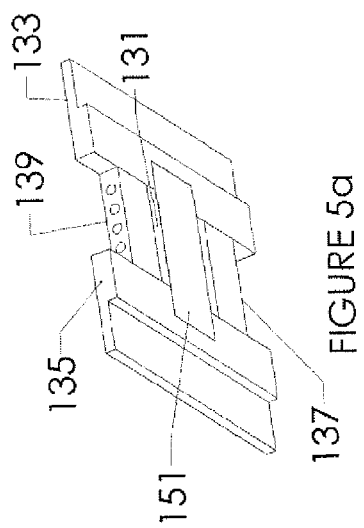
FIGURE 5a
FIGURE 5b

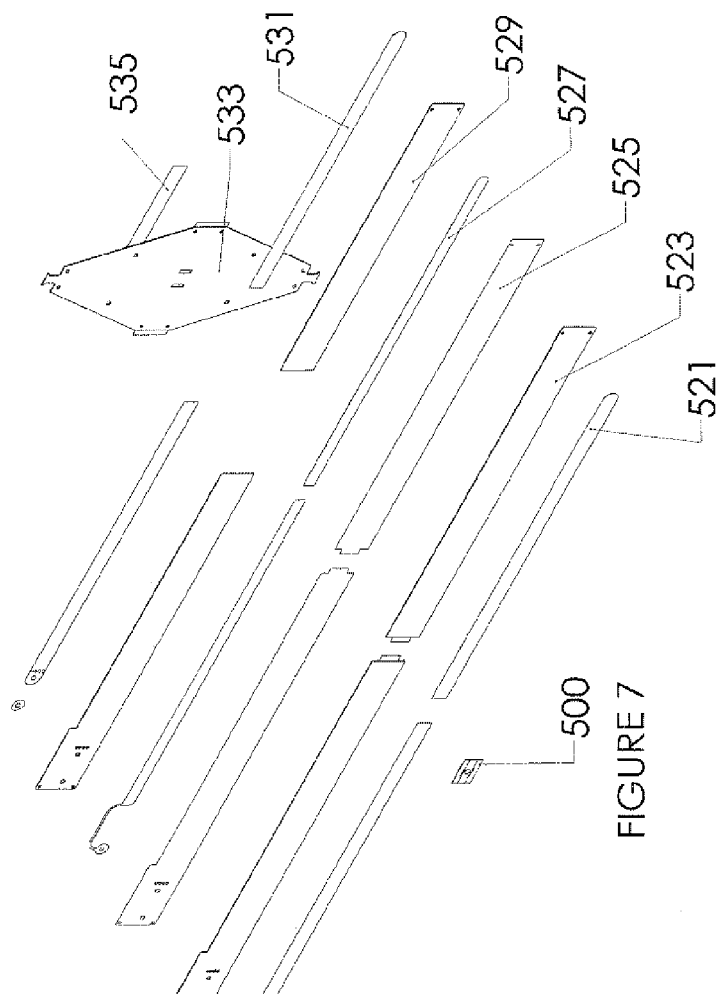
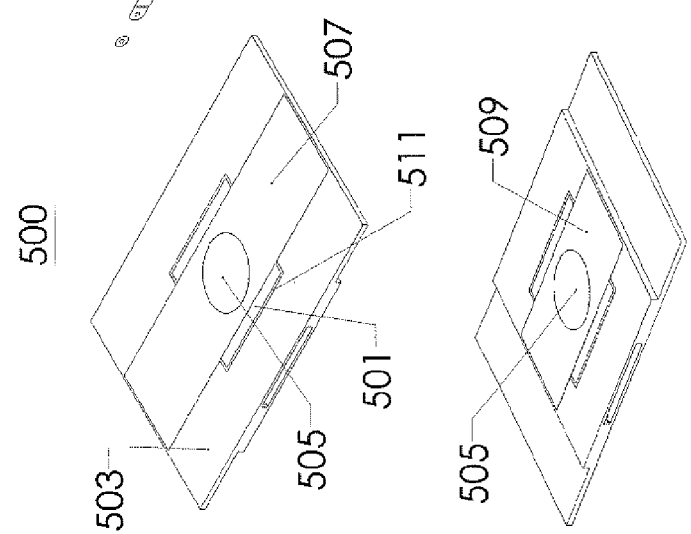
FIGURE 7
FIGURE 6

BLUMLEIN ASSEMBLY WITH SOLID STATE SWITCH

BACKGROUND

1. Field of the Invention

This application relates generally to high voltage pulse generators, particle accelerators and Blumlein structures, and, more specifically, to the incorporation of switches into such structures.

2. Background Information

Particle accelerators are used to increase the energy of electrically charged atomic particles. In addition to their use for basic scientific study, particle accelerators also find use in the development of nuclear fusion devices and for medical applications, such as cancer therapy. One way of forming a particle accelerator is by use of a dielectric wall type of accelerator, an example of which is described in U.S. Pat. No. 5,757,146, that formed out of one or more Blumlein structures. A Blumlein is basically a set of three conductive layer or strips with the two spaces between the strips being filled with dielectric material to produce a pair of parallel transmission lines: the first transmission line is formed by the top and middle conductive strips and the intermediate dielectric layer; the second transmission line is formed by the bottom and middle conductive strips and the intermediate dielectric layer. The common, middle conductive layer is shared by the pair of lines. By holding the upper and lower conductive layers at ground, charging the shared middle layer to a high voltage, and then discharging the middle layer, a pair of waves then travels down the pair of transmission lines. By arranging for this structure for the waves to produce a pulse at one end, the result field can be used to accelerate a particle beam.

Within these various applications, there is an ongoing need to make particle accelerators more powerful, more compact, or both. Consequently, such devices would benefit from improvements in Blumlein technology.

SUMMARY OF THE INVENTION

According to a first set of general aspects, a blumlein structure is presented. The blumlein includes a first planar conductive strip, a second planar conductive strip parallel to the first planar conductive strip, and a third planar conductive strip parallel to the first and second planar conductive strip, where the second strip is positioned between the first and third planar conductive strips. The blumlein also includes a first dielectric strip and a switch module including a switch formed of a semiconductor material between a first terminal and a second terminal. The first and second terminals are respectively connected to the first and the second planar conductive strips, where the first dielectric strip and the switch module are joined together to fill the space between the first and second planar conductive strips, and where the first dielectric strip and the switch module are joined to have a boundary having at least a portion that is formed to be non-orthogonal to the first and second planar conducting strips. A second dielectric strip that fills the space between the second and third planar conductive strips.

According another set of aspects, a blumlein structure includes a first planar conductive strip, a second planar conductive strip parallel to the first planar conductive strip, and a third planar conductive strip parallel to the first and second planar conductive strip, where the second planar conductive strip is positioned between the first and third planar conductive strips. The blumlein structure also includes first dielectric and second dielectric strips, where the second dielectric strip fills the space between the second and third planar conductive strips. The blumlein structure further includes a switch module having an optically activated switch with a first terminal and a second terminal respectively connected to the first and the second planar conductive strips, where the first dielectric strip and the switch module are joined together to fill the space between the first and second planar conductive strips. The switch extends laterally to both sides beyond the space between the first and second planar conductive strips and the switch module also includes first and second ferrules, one each attached to the sides of the switch that extends laterally beyond the space between the first and second planar conductive strips, each ferrule holding one or more optical fibers optically coupled to the switch.

In another set of aspects, a method of attaching a switch to a blumlein is described. A switch is received and a first holder made of dielectric material to a first side on the switch. The switch has a first terminal formed on a top surface, a second terminal formed on an opposing bottom surface, and formed of a semiconductor material between the first and second terminal. First and second conductive planar strips are attached to the first dielectric strip, the first holder and the switch, so that when attached the first dielectric strip, first holder and switch fill the space between the first and second planar conductive strips. The first and second conductive planar strips and the first dielectric strip form a first transmission line of a blumlein, and the first and second terminals respectively contact the first and second conductive planar strips. The first dielectric strip and the first holder are joined to have a boundary having at least a portion that is formed to be non-orthogonal to the first and second planar conducting strips.

According to still other aspects, a method of forming a blumlein structure is presented. An optically activated switch is received, the switch having a first terminal formed on a top surface, a second terminal formed on an opposing bottom surface, and formed of a semiconductor material between the first and second terminal. First and second conductive planar strips are attached to a first dielectric strip and the switch, so that the first dielectric strip and switch fill the space between the first and second planar conductive strips. The first and second conductive planar strips and the first dielectric strip form a first transmission line of a blumlein, with the first and second terminals respectively contact the first and second conductive planar strips The switch extends laterally to both sides beyond the space between the first and second planar conductive strips and first and second ferrules are attached, one each attached to the sides of the switch that extend laterally beyond the space between the first and second planar conductive strips, each ferrule having one or more openings for holding optical fibers to optically coupled to the switch.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 1 shows one exemplary embodiment for a blumlein module.

FIG. 2 is a cross-section view of the central portion of the embodiment of FIG. 1.

FIGS. 3a-c illustrate a number of different interfaces of materials between conductors.

FIGS. 4a and 4b illustrate an embodiment for a switch module assembly.

FIG. 4c shows several possible switch profiles.

FIGS. 5a-d illustrate the placement of the switch module of FIGS. 4a and 4b into the blumlein embodiment of FIGS. 1 and 2.

FIG. 6 shows an alternate embodiment of a switch module.

FIG. 7 shows components of an alternate blumlein embodiment using the switch module of FIG. 6.

DETAILED DESCRIPTION

Figure 8:
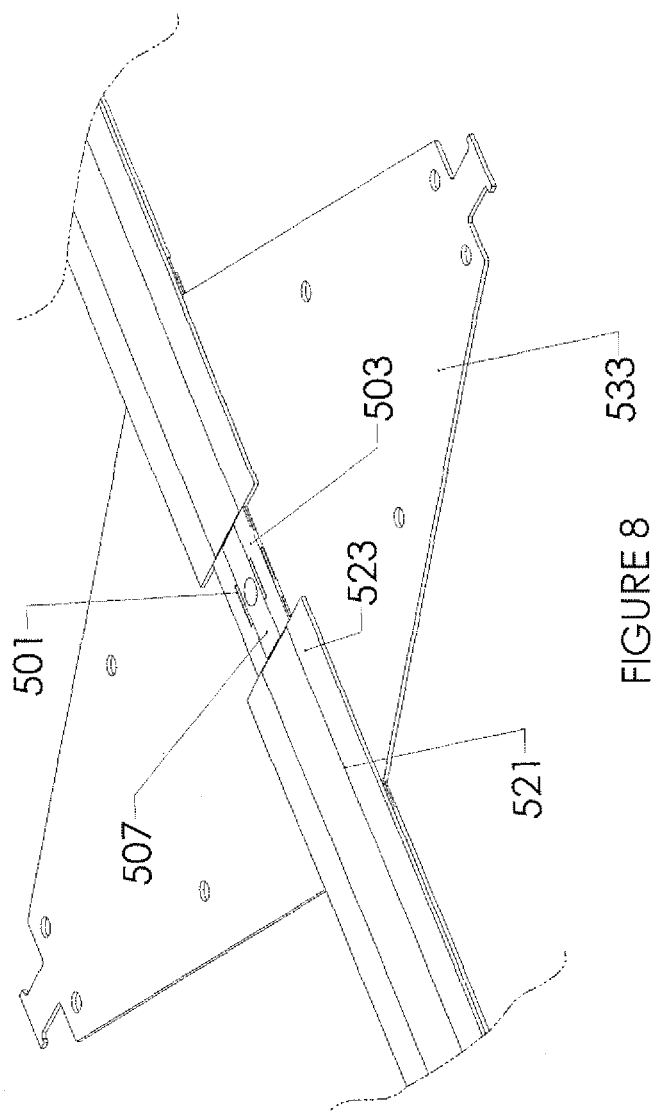
FIG. 8 is an enlarged view of the assembled central portion of the embodiment illustrated in FIG. 7.

FIG. 1 is a first exemplary embodiment in which the various aspects presented here can be applied. FIG. 2 is a side view of the center portion of a cross-section through the middle of the same embodiment, taken along the axis indicated along A in FIG. 1. Referring first to FIG. 2, the blumlein module is formed a top conducting strip 101, a middle conducting strip 103, and a bottom conducting strip 105 that run parallel from left to right with uniform spacing between each pair. The space between the middle conductive strip 103 and the bottom conductive strip 105 is filled with dielectric material to form the bottom transmission line. Here the dielectric is formed of three components, 111, 113, and 115, for reasons that will be explained below, but in other embodiments this can be a single element. The top transmission line is formed by the top (101) and middle (103) conductive strips with the space in between filled with switch structure or module with dielectric material 121 and 125 on either side. The switch module structure is formed of the switch 131 itself, having electrical contacts 143 and 141 on the top and bottom respectively connected to the top and middle conductive strips, and a holder or connector 133 and 135 on either side where the switch interfaces the dielectrics 121 and 125. The blumlein module can then be used for forming a particle accelerator, where several such modules are often stacked, as well as other application that need a pulsed, high-voltage energy source, such as a radar transmitter, for example.

In the embodiment of FIGS. 1 and 2, the bottom dielectric (111, 113, 115) and the top dielectric (101, 103) are taken to be of the same thickness and of the same material. More generally, other arrangement may be used, as may other geometries, but the shown arrangement is useful for discussing the various aspects presented below. More detail and other examples can be found in US patent publication number 2010/0032580 and U.S. Pat. Nos.: 5,757,146; 5,511,944; and 7,174,485. More detail on a suitable switch 131 is described: G. Caporaso, "New Trends in Induction Accelerator Technology", Proceeding of the International Workshop on Recent Progress in Induction Linacs, Tsukuba, Japan, 2003; G. Caporaso, et. al., Nucl Instr. and Meth. in Phys. B 261, p. 777 (2007); G. Caporaso, et. al., "High Gradient Induction Accelerator", PAC'07, Albuquerque, June 2007; G. Caporaso, et. al., "Status of the Dielectric Wall Accelerator", PAC'09, Vancouver, Canada, May 2009; J. Sullivan and J. Stanley, "6H-SiC Photoconductive Switches Triggered Below Bandgap Wavelengths", Power Modulator Symposium and 2006 High Voltage Workshop, Washington, D.C. 2006, p. 215 (2006); James S. Sullivan and Joel R. Stanley, "Wide Bandgap Extrinsic Photoconductive Switches" IEEE Transactions on Plasma Science, Vol. 36, no. 5, October 2008; and Gyawali, S. Fessler, C. M. Nunnally, W. C. Islam, N. E., "Comparative Study of Compensated Wide Band Gap Photo Conductive Switch Material for Extrinsic Mode Operations", Proceedings of the 2008 IEEE International Power Modulators and High Voltage Conference, 27-31 May 2008, pp. 5-8.

Referring back to FIG. 1, the exemplary switch structure is light activated by laser light as supplied by the optic fibers 141 and 143 that are held on the sides of the switch 131 by the ferules 137 and 139, respectively. The middle portion 113 of the bottom dielectric extends to the sides to help support the fibers 145 and 147 and can also serve a heat sink function. The upper conductive strip 101 and lower conductive strip 105 are electrically connected on the left side of FIG. 1. Several such blumlein modules can then be stacked to form an accelerator.

Unlike the arrangement of the blumleins described in the references cited above, where the switch structure is placed off to the end of the module, in the exemplary embodiments the switch is centrally placed between the top and middle conductive strips. Because of this difference, a brief description its operation will now be given. Referring to FIG. 1, assume that the accelerator is on the right side of the blumlein, or, more generally in the case of other applications, that the pulse to be presented on the right hand side. The one transmission line is the right "wing" of the top half (the dielectric 125 between the top conducting strip 101 and middle conducting strip 103 to the right of the switch module), and the second transmission line is the left "wing" of the top half of the left "wing" (to the left of the switch) plus the whole transmission line on the bottom (along dielectrics 111, 113, 115), which comprises the bottoms of the right and left "wings". Initially the top and bottom conductive strips (101, 105) are at ground and the middle conductive strip 103 is at a high voltage. The switch is then turned on.

The pulse generated by the switch start moving in both directions away from the switch in the top transmission lines. The left wings of the top and of the bottom lines are connected by a low resistance, which can just a short connection between them; for example, the connection can go through a hole or metalized via through the body of the blumlein. Consequently, the pulse will continue to move back to the right in the "bottom" transmission line after it riches the end at the left top line, but its electric field is now upside-down. The right ends of the bottom and the top transmission lines are not connected (there is a high resistance between them). Because of this, the pulse will be reflected when it reaches the right end of the right top transmission line and start moving towards the switch. When this reflected pulse reaches the switch (that is still open, so its resistance is low), the pulse will be reflected again but with 180 degree shifted phase, which means that its polarity will be opposite (its electric field turned over also). The second time reflected pulse will be moving toward the accelerator and will get the accelerator at the same time when bottom pulse will get there. Sum of these two pulses will make a pulse with a double voltage amplitude.

Under the arrangement of FIGS. 1 and 2, the switch 131 is itself placed between top conductive strip and the central conductive strip. Consequently, the switch is subjected to high electric field values. As the dielectric constant of the switch will typically not match that of the adjoining dielectric material, this can lead to charge accumulation at the interface between these. This problem is considered in the following section. For a light activated switch, such as that of the exemplary embodiment, another problem is that the ferrules used to provide the illumination source also need to be able to handle the high field levels while still providing sufficient light. The arrangement of the ferrules is then considered in a subsequent section.

Blumlein with Encapsulated Solid-State Switch

This section considers in more detail some techniques for building blumlein devices where materials bonded together and whose interface operates under very high electrical fields, over 30 kV/mm for example. The weakest part of high voltage devices is often an interface between bonded materials with different dielectric constants. Electrical charge tends to accumulates at the interface, due to difference in permittivity of joint media and due to local high electrical fields created by imperfections at the interface. The higher electrical field, which is produced by the extra charge, and higher charge mobility along the interface, increase the probability of the electrical breakdown through the interface. The methods described here minimize these problems and allow for the building of blumlein devices with encapsulated solid state switches.

Considering the problem itself further, FIG. 3a shows the interface 305 of length L between bonded materials M1 301 and M2 303, which is inserted into electrical field $E=Uo/\in d$, where $\in$ is an effective permittivity at the interface 305, that is created by powering the metal contacts/terminals on top plate 307 and at the bottom plate 309 of the device that are separated by a distance d to a voltage difference of Uo. Here M1 301 and M2 303 respectively correspond to the dielectric 121 and the switch 131 of FIGS. 1 and 2. In a typical implementation, d may be on the order ~1 mm and Uo may 25 kV up to 100 kV. The interface boundary 305 is orthogonal or normal to the surface of the upper and lower plates (307, 309), so that d is the same as L. In this case, the electrical field along the interface is the same as it is across the body of the device. Dielectric materials can usually be optimized for high voltage applications and there are number of available materials that can withstand electrical fields over 30-100 kV/mm. In the exemplary embodiments the body of the switch is formed a semiconductor, specifically silicon carbide, so that there will typically be a mismatch between the permittivity between it and the dielectric of the blumlein transmission line.

The simple interface arrangement shown in FIG. 3a can usually withstand electrical fields only up to about 10 kV/mm. To withstand higher values, the exemplary embodiments use developed interfaces between bonded materials. FIGS. 3b and 3c present examples of such developed interfaces, where the first of these has a diagonal interface 305' and the second a stepped interface 305". Preferably, the sharp corners in an arrangement such as FIG. 3c are rounded somewhat, but this is usually obtained as a result of fabricating process. In either of these cases, the effective electrical field along the interface is $E=Uo/\in L$, so that the ability of the interface to withstand high voltages is improved by this increasing the interface length L by having at least a portion of the interface running in a direction that is non-orthogonal between the conducting surfaces.

The exemplary switch used here is an optically activated semiconductor switch formed largely of silicon carbide, but in other embodiments could be of a semiconductor material, such as GaN, AlN, ZnSe, ZnO, diamond, doped glasses, semiconductor particles/crystallites embedded into insulator materials, and so on. For any of these, there will typically be a resultant mismatch in permittivity between it and the adjacent dielectric used in the blumlein's upper transmission line. Such a switch will often come rectangularly shaped, more or less, so that if directly bonded to the dielectric it would present the sort of cross-section shown in FIG. 3a. As the switch itself may not readily be shaped (or reshaped) to have a different profile, rather than have the switch directly adjoining the dielectric, a connecting structure, or carrying unit, is used as part of the switch module for this purpose. The formation of a switch module is illustrated with respect to FIGS. 4a and 4b.

FIG. 4a shows an assembled switch module structure for the opto-switch 131 to be placed into the blumlein and FIG. 4b shows an exploded view of the elements. The module includes the connectors 135 and 133 and the ferrules 139 and 137. The ferrules 137 and 139 can be used to maintain optical fibers for triggering the switch as well as for a heat sink. The optical fibers, and hence the ferrules, are discussed further in the next section and are used as the exemplary switch 131 is optically activated, but would not be required in other embodiments where the switch 131 is otherwise activated. In this particular version, which corresponds to the embodiment of FIGS. 1 and 2, the connectors 133 and 135 and ferrules 137 and 139 are separately elements, but in other embodiments (such as discussed further below) they can be a solid unit instead of using an assembly. The overall dimensions of units 133, 135 and 137, 139 can vary depending on particular design. The solid state switch 131 has with terminal T 143 and a similar terminal 141 on its underside. Once the elements shown in FIG. 4b are assembled contacts C 153 and a similar contact (151, see FIG. 5a) on the bottom can be added to the module assembly, as shown in FIG. 4a. The module contacts are here plated after module has bonded. (In FIG. 2, the contact C 153 is not shown separately, but can be taken as part of the upper conducting strip 101, with the bottom contact similarly incorporated into the middle strip 103.)

The side portions 133 and 135 of the module can be formed of a material having a permittivity close to that of the switch material. For example, these could be made of epoxy, as could the ferrules 137, 139. Because of this, although the profile of the switch 131 may result in the interface between it and the connectors 133 and 135 being as in FIG. 3a, the relatively similar permittivity values shift the problem to the interface between the connectors 133 and 135 and the dielectric of the transmission, such as 121 and 125, respectively, in FIGS. 1 and 2. As both the connectors and the dielectric will usually be able to have their shapes easily formed into more arbitrary shapes than the switch, the can have an elongated interface having a portion that is substantially non-orthogonal to the conducting surfaces, such as those shown in FIGS. 3b and 3c.

Although the discussion here is for the encapsulation of a switch within a blumlein structure, the same technique can similarly be applied to other cases where two elements need to have an interface between to such conductors at a high voltage difference, but have differing permittivity values. For the element with a relatively short interface between the plates, another material having a relative similar permittivity can be introduced to allow this interface to withstand higher field values. The other element can then have its interface with introduced connecting material shaped to increase this interface that will then have the greater discontinuity in permittivity values. Additionally, although the profile of the switch 131 in the example is taken to be like that on the left of FIG. 4c, it may have other profiles, with examples shown center and right. In these case, although the shape of the switches will allow them to withstand higher field levels and remove the need for the elements 133 and 135 of the module, the use of such connectors can be to further increase the field strengths the interface can handle, both further lengthening the interface and also splitting up the amount of transition in relative permittivity change over two transitions. Aside from these considerations, the use of such a module can be useful for placing the switch within the blumlein as silicon carbide does not readily bond to many other materials.

FIG. 5a is a down-up view for the same module assembly as in FIG. 4a. This module can then be inserted into a blumlein and the whole assembly coupled optical fibers F 145 and 147, as shown in FIG. 1. It also includes a heat sink unit/support 113 as shown in FIG. 5b, which includes a portion of the bottom conductive strip 105, and two blumlein wings as shown in FIG. 5d. One example of the assembling procedure is shown in FIG. 5c: first, the ferrules 137 and 139 are bonded to the switch, followed by bonding units 133 and 135 to the assembly. Then module can bonded to the blumlein wings. After that, electrical contact between module contacts and blumlein strip lines have to be established. It is important that the assembly allows access to the top and middle strips of the blumlein to complete formation of the upper and middle conductive strips 101 and 103. After this is the bonding of the heat sink unit 113 to the assembly, followed by making electrical contact between bottom strip of the heat sink unit 113 and bottom strips of the blumlein to complete the bottom conducting strip 105.

Optical Coupling of Switch to Light Source

As noted above, the exemplary embodiment of a blumlein structure uses a light activated switch. This section considers the coupling of the illumination to the switch. Although the exemplary embodiment uses the side connector structures 133 and 135 discussed in the last section as well as the ferrules 137 and 139 discussed in this section, more generally, these as independent aspects. For example, the switch may be light activated, but not require the connector structures 133 and 135; conversely, these side connectors can be used for switch that is activated by other means not requiring the optic fibers.

To activate the switch, it needs to be sufficiently illuminated. This can be done by use of the ferrules, placed on either side of the switch, holding optical fibers so that they optically couple to the switch. The other ends of the fibers could then be illuminated by a laser, for example, to effect turning the switch on and off. The amount of light on the switch will then be based on the number of fibers, their cross-sections, and the intensity of the light. As the ferrules with be subjected to the field between the upper and middle conductive strips of the blumlein, they will need to be able to support this field without breaking down. The more space given over to the optical fibers, the less field it will be able to support. On this basis, it makes sense to reduce the number, cross section, or both, of the fibers; however, this would require an increase in the intensity of light. Also, having too many fibers increases the complexity of the design. As the switch can only withstand a certain level of fluence, or light energy per area, on its surface before the switch is damaged, the intensity of the light must be balanced against the number and size for the fibers. Similarly, although increasing the width of the conducing strips can provide a larger pulse from the blumlein, this will place more of ferrules under a higher field. Consequently, a number factors need to be balanced when optimizing the design.

As shown in FIG. 4b, for example, the ferrule portions 137 and 139 of the switch module assembly has several holes for the insertion of the optical fibers, shown as 145 and 147 in FIG. 1. Although larger openings would allow for larger fibers, and correspondingly more illumination on the switch 131, this would make the ferrules breakdown at lower field strengths. (In the example, the openings are round, as this shape is useful when round optic fibers are used, but rectangular or other shaped openings could also be used.) In one of the principle aspect of this section, top and central conducting strips are formed so that the switch is allowed to extend laterally to either side before the interface with the ferrules, allowing a margin so that ferrules are not placed directly between the plates. Although the ferrules still be subjected high filed levels, this will reduce it below the full strength between the plates. As to the width selected for the conductive, this is again a design choice as the wider the conductive strips, the stronger the pulsed that can be produced, but a wider strip then makes the ferrules more likely to break down.

In the exemplary embodiment for the switch module described with respect to FIGS. 4a and 4b, the ferrules 137 and 139 each hold four fibers; and although the figures are not fully to scale, the do illustrate the relative size of the openings to the ferrule as a whole. Any bonding agent for the fibers to the switch would need to be transparent. The exemplary switch is formed of silicon carbide. As the fibers cannot be readily bonded to this material, the ferrules are used to mechanically the bond the fibers by holding them up to the switch. The ferrules can be made of the same material as the side pieces 133 and 135, such as epoxy. In the embodiments discussed so far, the side pieces 133, 135 and ferrules 137, 139 are formed separately and then joined together. This is convenient for discussing the independent aspects associate with each of this elements and although it is preferred in some applications, in other cases it is preferable that these elements of the switch module are formed of a single piece. Such a unified embodiment for the switch holder is discussed in the next section.

Single Piece Holder with Ferrules

FIGS. 6 shows a top and bottom view of switch module 500 respectively at top and bottom. The silicon carbide (or other semiconductor) switch 501 is placed into the monolithic dielectric switch carrier 503. Here the holder 503 includes both the shape having a non-orthogonal ends where it will interface with the dielectric and a set of 6, in this version, openings for optic fibers on each of the sides. In other embodiments, if the switch is not light activated, the holder need not have the ferrule function and the holes could be eliminated and, if desired, the conductive strips could be widened; conversly, if the elongated end profile is not needed due to mismatch in permittivities, the ends could be square will the holder would still perform the ferrule function. The space between the switch 501 and holder 503 can then be filled in with epoxy or other filler 511. The a portion 507 of the top conductive strip and a portion 509 of the bottom conductive strip run along the outside of the module are formed of, for example, copper. The contact terminals are shown at 505 for illustration purposes, although these are actually below the strips 507 and 509.

FIG. 7 shows an exploded view of a blumlein structure for this embodiment. The top portion 507 of the conductive strip of the switch module assembly is connected to the rest of the top planar conductive strip 521 having left and right portions and which can again be made of copper or other conductor. The top dielectric strip 523 again has left and right wings and can be made of Cirlex® or kapton, for example. In this embodiment, a bonding layer 525 is then between the top dielectric strip 523 and the middle planar conductive strip 527, where each again has left and right portions and the thin dielectric buffer layer 525 can be applied to bond layers such 523, 527 and 529 together. The middle planar conductive strip wings can again be of copper or other conductive material and will connect together through the bottom contact strip 529 of the switch module. The bottom dielectric layer is formed of the dielectric strip 531, again with two wings, and a central portion made of the support 533, where these could again be of Cirlex® or kapton, for example. The bottom planar conductive strip can again be of copper or other suitable conductor and is here formed of a first part 531 of left and right wings and also a middle piece 535 for under the support 533. Rather than have a single piece for the bottom semiconductor layer, it is often convenient to use the support 513 as this can support the fibers as they feed into the ferrules, as well as being useful for mounting the blumlein modules and serving a heat sinking function. The central portion of the blumlein structure when assembled is shown in an enlarged view in FIG. 8. The embodiment in FIGS. 7 and 8 is again evenly spaced between the pairs of conductors, symmetric in that the switch is centrally located, and uses the same material for the dielectrics in both the top and bottom transmission lines, but other embodiment can use other arrangements for any of these.

Conclusion

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A blumlein structure, comprising;
   a first planar conductive strip;
   a second planar conductive strip parallel to the first planar conductive strip;
   a third planar conductive strip parallel to the first and second planar conductive strip, where the second planar conductive strip is positioned between the first and third planar conductive strips;
   a first dielectric strip;
   a switch module including a switch formed of a semiconductor material between a first terminal and a second terminal, where the first and second terminals are respectively connected to the first and the second planar conductive strips, where the first dielectric strip and the switch module are joined together to fill the space between the first and second planar conductive strips, and where the first dielectric strip and the switch module are joined to have a boundary having at least a portion formed to be non-orthogonal to the first and second planar conducting strips; and
   a second dielectric strip that fills the space between the second and third planar conductive strips.

2. The blumlein structure of claim 1, wherein the switch module further includes:
   a connector attached to the semiconductor material of the switch and by which the switch module is joined to the first dielectric strip.

3. The blumlein structure of claim 2, wherein the connector is formed of a material having a dielectric constant closer to the dielectric constant of the semiconductor material than that of the first dielectric material.

4. The blumlein structure of claim 3, wherein the connector and the semiconductor material of the switch are joined to have a boundary having that is substantially perpendicular to the first and second planar conducting strips.

5. The blumlein structure of claim 2, wherein the connector is physically bonded to the first dielectric strip.

6. The blumlein structure of claim 2, wherein the connector is chemically bonded to the first dielectric strip.

7. The blumlein structure of claim 2, wherein the connector is epoxy.

8. The blumlein structure of claim 2, wherein the first dielectric strip includes a first portion and a second portion, the switch module being positioned between the first and second portions and being respectively attached thereto on opposing side by a first part and a second part of the connector.

9. The blumlein structure of claim 8, further comprising a heat sink unit.

10. The blumlein structure of claim 8, wherein the switch is light activated and the switch module further includes:
    first and second ferrule portions on opposing side of the switch and not positioned between the first and second conductive strips, the ferrules each for holding one or more optical fibers to thereby optically couple the optical fibers to the switch.

11. The blumlein structure of claim 10, wherein the first and second part of the connector and the first and second ferrule portions are formed of a single piece of material.

12. The blumlein structure of claim 10, wherein the first and second part of the connector and the first and second ferrule portions are formed of separate pieces of material.

13. The blumlein structure of claim 1, wherein the first and second dielectric materials are the same.

14. The blumlein structure of claim 1, wherein spacing between the second and third planar conductive strips is formed to be the same as spacing between the first and second planar conductive strips.

15. The blumlein structure of claim 1, wherein the semiconductor material includes silicon carbide.

16. The blumlein structure of claim 1, wherein the first and third conductive strips are electrically connected at a first end of the blumlein structure.

17. A blumlein structure, comprising:
    a first planar conductive strip;
    a second planar conductive strip parallel to the first planar conductive strip;
    a third planar conductive strip parallel to the first and second planar conductive strip, where the second planar conductive strip is positioned between the first and third planar conductive strips;
    a first dielectric strip;
    a second dielectric strip that fills the space between the second and third planar conductive strips; and
    a switch module including:
      an optically activated switch having a first terminal and a second terminal respectively connected to the first and the second planar conductive strips, where the first dielectric strip and the switch module are joined together to fill the space between the first and second planar conductive strips, wherein the switch extends laterally to both sides beyond the space between the first and second planar conductive strips; and
      first and second ferrules, one each attached to the sides of the switch that extends laterally beyond the space between the first and second planar conductive strips, each ferrule having one or more openings for holding optical fibers to optically couple to the switch.

18. The blumlein structure of claim 17, wherein the first and second ferrules are formed as part of a monolithic dielectric switch carrier.

19. The blumlein structure of claim 17, wherein each of the ferrules has a plurality of openings for the holding of optical fibers.

20. The blumlein structure of claim 19, wherein the openings are circular.

21. The blumlein structure of claim 19, wherein the openings are rectangular.

22. The blumlein structure of claim 17, wherein the semiconductor material includes silicon carbide.

23. A method of attaching a switch to a blumlein structure, comprising:
receiving a switch, the switch having a first terminal formed on a top surface, a second terminal formed on an opposing bottom surface, and formed of a semiconductor material between the first and second terminal;
attaching a holder made of dielectric material to a first side on the switch;
attaching a first dielectric strip to the holder so that the holder is between the switch and the first dielectric strip;
attaching first and second planar conductive strips to the first dielectric strip, the holder and the switch so that when attached the first dielectric strip, holder and switch fill the space between the first and second planar conductive strips, where the first and second planar conductive strips and the first dielectric strip form a first transmission line of a blumlein, and where the first and second terminals respectively contact the first and second planar conductive strips, and
wherein the first dielectric strip and the holder are joined to have a boundary having at least a portion that is formed to be non-orthogonal to the first and second planar conducting strips.

24. The method of claim 23, wherein the holder is formed of a material having a dielectric constant closer to the dielectric constant of the semiconductor material than that of the first dielectric strip.

25. The method of claim 24, wherein the holder and the semiconductor material of the switch are joined to have a boundary having that is substantially perpendicular to the first and second planar conducting strips.

26. The method of claim 23, further comprising physically bonding the holder to the first dielectric strip.

27. The method of claim 23, further comprising chemically bonding the holder to the first dielectric strip.

28. The method of claim 23, wherein the holder is formed of epoxy.

29. The method of claim 23, further comprising:
attaching top and bottom contact strips to the first and second terminals, wherein the top and bottom contact strips are connected to respectively form part of the first and second planar conductive strips.

30. The method of claim 23, wherein holder includes a first portion and a second portion, the switch being positioned between the first and second portions of the holder, and wherein the first dielectric strip includes a first portion and a second portion respectively being attached to the first and second portions of the holder.

31. The method of claim 30, wherein the switch is light activated and the method further includes:
attaching first and second ferrules on opposing side of the switch and not positioned between the first and second conductive strips, the ferrules each including one or more openings for the attachment of optical fibers to thereby optically couple the optical fibers to the switch.

32. The method of claim 30, wherein the first and second parts of the holder and the first and second ferrules are formed of a single piece of material.

33. The method of claim 30, wherein the first and second parts of the holder and the first and second ferrules are formed of separate pieces of material.

34. The method of claim 23, wherein the semiconductor material includes silicon carbide.

35. The method of claim 23, further comprising:
attaching a third planar conductive strip and a second dielectric strip, wherein the third planar conductive strip is parallel to the first and second planar conductive strip, where the second planar conductive strip is positioned between the first and third planar conductive strips, and wherein the second dielectric strip fills the space between the second and third planar conductive strips, thereby forming a second transmission line of the blumlein.

36. The method of claim 35, further comprising:
electrically connecting the first and third conductive strips at a first end of the blumlein structure.

37. A method of forming a blumlein structure, comprising:
receiving optically activated switch, the switch having a first terminal formed on a top surface, a second terminal formed on an opposing bottom surface, and formed of a semiconductor material between the first and second terminal;
attaching first and second planar conductive strips to a first dielectric strip and the switch so that the first dielectric strip and switch fill the space between the first and second planar conductive strips, wherein the first and second conductive planar strips and the first dielectric strip form a first transmission line of a blumlein, wherein the first and second terminals respectively contact the first and second planar conductive strips, and wherein the switch extends laterally to both sides beyond the space between the first and second planar conductive strips; and
attaching first and second ferrules, one each attached to the sides of the switch that extend laterally beyond the space between the first and second planar conductive strips, each ferrule having one or more openings for holding optical fibers to thereby optically couple the optical fibers to the switch.

38. The method of claim 37, wherein the first and second ferrules are formed as part of a monolithic dielectric switch carrier.

39. The method of claim 37, wherein the semiconductor material includes silicon carbide.

40. The method of claim 37, further comprising:
attaching an optical fiber to each of the one more openings, thereby optically coupling the fibers to the switch.

41. The method of claim 37, wherein the openings are circular.

42. The method of claim 37, wherein the openings are rectangular.

43. The method of claim 37, wherein each of the ferrules has a plurality of openings for the holding of optical fibers.

44. The method of claim 37, further comprising:
attaching a third planar conductive strip and a second dielectric strip, wherein the third planar conductive strip is parallel to the first and second planar conductive strip, where the second planar conductive strip is positioned between the first and third planar conductive strips, and wherein the second dielectric strip that fills the space between the second and third planar conductive strips, thereby forming a second transmission line of the blumlein.

45. The method of claim 37, wherein the first dielectric strip includes a holder portion, wherein the first dielectric strip is attached to the switch such that the holder portion is between the switch and the rest of the first dielectric strip.

* * * * *